United States Patent
Fujimura

(10) Patent No.: US 6,906,262 B2
(45) Date of Patent: Jun. 14, 2005

(54) FLEXIBLE PRINT CIRCUIT, WIRE HARNESS, AND WIRING STRUCTURE USING SHAPE MEMORY MATERIAL

(75) Inventor: Yuichi Fujimura, Asaka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/860,579

(22) Filed: Jun. 4, 2004

(65) Prior Publication Data

US 2004/0248434 A1 Dec. 9, 2004

(30) Foreign Application Priority Data

Jun. 9, 2003 (JP) .......................................... 2003-164059

(51) Int. Cl.[7] .......................... H01B 7/08; H02G 11/00
(52) U.S. Cl. ................................ 174/72 A; 174/117 F
(58) Field of Search ........................... 174/72 A, 113 R, 174/117 F, 117 FF, 117 R

(56) References Cited

U.S. PATENT DOCUMENTS

| | | | | |
|---|---|---|---|---|
| 3,895,362 A | * | 7/1975 | Yamakawa et al. ............ | 365/57 |
| 5,105,055 A | * | 4/1992 | Mooney et al. ......... | 174/117 FF |
| 5,154,625 A | * | 10/1992 | Borokowski et al. ........ | 439/161 |
| 5,800,500 A | * | 9/1998 | Spelman et al. ............. | 607/137 |
| 6,194,664 B1 | * | 2/2001 | Zamora et al. ........... | 174/117 F |
| 6,323,428 B1 | * | 11/2001 | Takano .................... | 174/117 F |
| 6,374,143 B1 | * | 4/2002 | Berrang et al. .............. | 607/137 |

FOREIGN PATENT DOCUMENTS

| | | |
|---|---|---|
| JP | 01-241900 A | 9/1989 |
| JP | 09-259643 A | 10/1997 |
| JP | 10-233588 A | 9/1998 |

* cited by examiner

*Primary Examiner*—Anthony Dinkins
*Assistant Examiner*—Adolfo Nino
(74) *Attorney, Agent, or Firm*—Sughrue Mion, PLLC

(57) ABSTRACT

In a flexible print circuit having a plurality of signal wires, core wires formed from a shape memory material are provided on the two end portions thereof in the direction of width, and are caused to memorize a wiring completion shape within an electronic instrument in advance. In a wire harness having a plurality of signal wires, core wires formed from a shape memory alloy are disposed on the two sides of the planar signal wire array, or positioned along the central axis of the signal wires which are bundled into circular form. A guide frame for guiding a wire harness having a plurality of signal wires and which is caused to memorize in advance a shape which removes the wire harness from the movement range of a movable component within the electronic instrument.

10 Claims, 4 Drawing Sheets

FIG.5A
FIG.5B
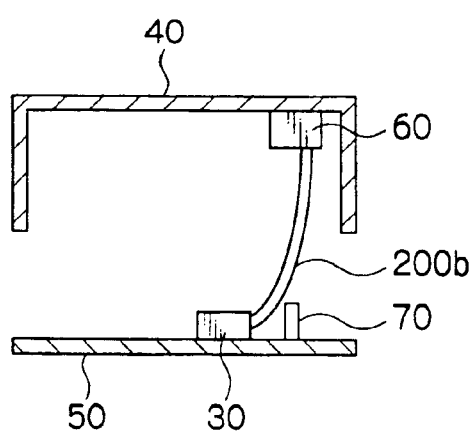
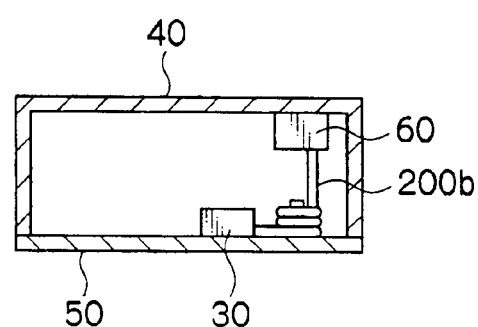

FLEXIBLE PRINT CIRCUIT, WIRE HARNESS, AND WIRING STRUCTURE USING SHAPE MEMORY MATERIAL

BACKGROUND OF THE INVENTION

1. Field of the Invention

The present invention relates to a wiring structure and, more particularly, to a wiring structure using a shape memory material.

2. Description of the Related Art

When a wiring member such as a wire harness or a flexible print circuit (FPC) is arranged in the gaps between electronic components or the like in an electronic instrument, the wiring member is typically formed so as to match the form of the gaps.

It has been proposed in the prior art that a shape memory alloy be used to form a conductive wire rod (or a shape memory alloy pipe or the like for holding the wire rod) that is connected to a predetermined location. Here, the wire rod or the like is caused to memorize a wiring completion shape in advance, and is then deformed into an arbitrary shape and connected to a wire rod terminal. The wire rod is then heated so as to recover the wiring completion shape (see Japanese Patent Application Publication No. 1-241900). In another proposal, the outer periphery of a wire harness is wrapped in a shape memory resin and the shape memory resin is caused to memorize the wiring shape of the wire harness in advance. The shape memory resin is then deformed into an easily transportable shape and transported, whereupon the shape memory resin is heated to recover the wiring shape (see Japanese Patent Application Publication 9-259643). In another proposal, a shape memory alloy sheet is caused to memorize an FPC accommodation completion shape in advance. Here, the shape memory alloy sheet is then deformed into a flat shape and superposed onto the FPC, and then restored to the accommodation completion shape (see Japanese Patent Application Publication 10-233588).

SUMMARY OF THE INVENTION

With conventional techniques in which a shape memory alloy is used as the conductive wire rod itself, the shape restoring temperature of the shape memory alloy must be suited to the usage temperature and so on of the wire rod and, moreover, a resistance value must be set to a suitable value for transmitting electric signals. Hence, it is sometimes impossible to find a suitable shape memory alloy for use as a wire rod which satisfies both of these conditions.

Meanwhile, with conventional techniques in which the outer periphery of a conductive wire rod is wrapped in a shape memory alloy pipe, a shape memory resin, or a shape memory alloy sheet, time is required for the periphery-wrapping operation. Moreover, in wire harnesses having a plurality of signal wires, the sectional area inevitably increases when the outer periphery is wrapped, thus taking up space within the electronic instrument.

Furthermore, with continuing reductions in the size and thickness of electronic instruments in recent years, it has become necessary to arrange wire harnesses or FPCs having a plurality of signal wires in extremely narrow gaps as if weaving between electronic components, and since the space for connecting the wire harnesses or FPCs with connectors inside the electronic instrument has also become extremely narrow, the labor and operating costs required for a wiring operation increase. No matter how complicated this operation becomes, demand for operating cost reductions and assurances of the reliability and stability of the wiring do not cease. Demands for a wiring completion shape which cannot be formed unless the cover is closed have also been made.

The present invention has been designed in consideration of such circumstances, and it is an object thereof to provide a wiring structure according to which operating costs can be reduced and the reliability and stability of the wiring can be ensured when a wiring member such as a wire harness or FPC having a plurality of signal wires are connected.

To achieve this object, a first aspect of the present invention is a flexible print circuit connected to a predetermined location within an electronic instrument, comprising:

a plurality of signal wires for transmitting a predetermined electric signal in the direction of length, and guiding core wires constituted by a shape memory material in which a wiring completion shape within the electronic instrument has been memorized, said guiding core wires being disposed on the two end portions of the flexible print circuit in the direction of width along the signal wires.

According to the first aspect, when the flexible print circuit is to be inserted into a connector, the wiring operation is performed after forming the flexible print circuit into a shape which allows easy connection to the connector, whereupon the guiding core wires can be restored to the wiring completion shape. Hence, operating costs can be reduced and the reliability and stability of the wiring can be easily ensured during the wiring of the flexible print circuit. Shape memory material is also provided on the two end portions in the direction of width, and hence the flexible print circuit can be formed without increasing the sectional area beyond that of a case in which shape memory material is wrapped around the outer periphery of the plurality of signal wires, thus saving space.

In a second aspect of the present invention, pertaining to the first aspect, the wiring completion shape memorized by the guiding core wires is a folded shape within said electronic instrument.

By means of this constitution, the operation to insert the flexible print circuit into the connector may be performed before recovering the folded shape, and hence insertion into the connector can be performed easily and securely. Moreover, since the flexible print circuit returns to the folded shape, forming operations can be eliminated, and the flexible print circuit can be housed inside the electronic instrument with stability.

A third aspect of the present invention is a wire harness connected to a predetermined location within an electronic instrument, comprising:

a plurality of signal wires for transmitting a predetermined electric signal in the direction of length, and guiding core wires constituted by a shape memory alloy in which a wiring completion shape within the electronic instrument has been memorized, said wire harness being one of a flat-type wire harness in which said plurality of signal wires are arranged in coplanar form and said guiding core wires are disposed on the two sides of the wire harness in the direction of width, and a round-type wire harness in which said plurality of signal wires are disposed on the outer periphery of said guiding core wire.

According to the third aspect, when the wire harness is to be inserted into a connector, the wiring operation is performed after forming the wire harness into a shape which allows easy connection to the connector, whereupon the guiding core wires can be restored to the wiring completion shape. Hence, operating costs can be reduced and the reliability and stability of the wiring can be easily ensured during the wiring of a wire harness having a plurality of signal wires. The shape memory alloy is also disposed on the two ends in the direction of width or in a central axial position, and hence the wire harness can be formed without increasing the sectional area beyond that of a case in which the guiding shape memory material is wrapped around the outer periphery of the plurality of signal wires, thus saving space.

In a fourth aspect of the present invention, pertaining to the third aspect, the wiring completion shape memorized by the guiding core wires is a coiled shape within the electronic instrument.

By means of this constitution, the operation to insert the wire harness into the connector may be performed before recovering the coiled shape, and hence insertion into the connector can be performed easily and securely. Here, the term "coiled shape" includes a spiral shape which is coiled upward, and a whorl shape which is wound in coplanar form. Since the wire harness returns to such a coiled shape, forming operations can be eliminated, and the wire harness can be housed inside the electronic instrument with stability.

In a fifth aspect of the present invention, pertaining to the first through fourth aspects, the guiding core wire is heated by the conduction of electricity to the core wire to enable easy deformation, and is cooled by cutting the flow of electricity to enable restoration of the wiring completion shape.

By means of this constitution, easy deformation of the shape memory material is enabled through electric conduction, and easy restoration of the shape memory material to the wiring completion shape is enabled by cutting the flow of electricity.

A sixth aspect of the present invention comprises a wiring structure, comprising:

a wire harness having a plurality of signal wires which are connected to a predetermined location within an electronic instrument, and a guide frame for guiding said wire harness, wherein said guide frame is constituted by a shape memory material in which a memorized shape that removes said wire harness from the movement range of a predetermined movable component with in said electronic instrument has been memorized, said guide frame being restored to said memorized shape after said wire harness is connected to the predetermined location within said electronic instrument.

According to the sixth aspect, even when a movable component is present within the electronic instrument, a wiring operation can be performed with the wire harness disposed within the movement range of the movable component, and once the wiring operation is complete, the guide frame can be shape-restored such that the wire harness is removed from the movement range. Hence, insertion of the wire harness into the connector can be performed easily and securely, complicated forming operations can be eliminated, and the wire harness can be housed inside the electronic instrument with stability. Here, a shape memory material does not have to be used for the wire harness, and hence the sectional area thereof does not have to be increased.

In a seventh aspect of the present invention, pertaining to the sixth aspect, the memorized shape memorized by the guide frame is so that the guide frame is wrapped around the outer periphery of the wire harness so that the wire harness is removed from the movement range of the movable component.

In an eighth aspect of the present invention, pertaining to the sixth aspect or seventh aspect, the guide frame is heated to enable easy deformation, and returns to the memorized shape when cooled.

By means of this constitution, easy deformation of the shape memory material is enabled through the application of heat, and easy shape restoration of the shape memory material is enabled by cooling.

According to the present invention as described above, operating costs can be reduced and the reliability and stability of the wiring can be easily ensured when a wire harness or flexible print circuit (FPC) having a plurality of signal wires are connected.

BRIEF DESCRIPTION OF THE DRAWINGS

FIGS. 5A and 5B are views showing an example of a wiring operation shape and a wiring completion shape when the wire harness to which the present invention is applied is caused to memorize a coiled shape as the wiring completion shape.

DESCRIPTION OF THE PREFERRED EMBODIMENTS

Preferred embodiments of a wiring structure according to the present invention will be described in detail below in accordance with the attached drawings.

[First Embodiment]

Figure 1A:
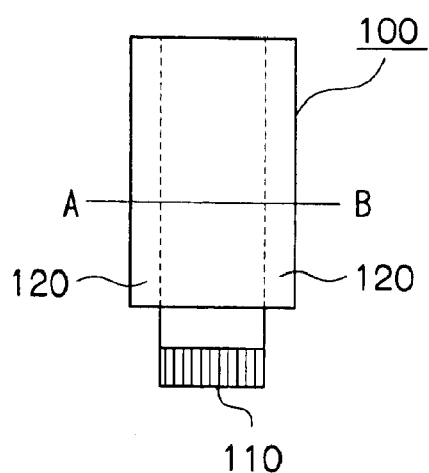
FIGS. 1A and 1B are views showing the main parts of a wiring structure of a first embodiment according to the present invention, using the example of a flexible print circuit.
Figure 1B:
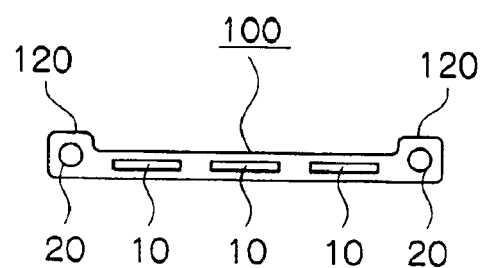

The main parts of a wiring structure of a first embodiment according to the present invention are illustrated in FIGS. 1A and 1B. FIG. 1A is a plan view of a flexible print circuit (to be referred to simply as "FPC" hereinafter) 100, and FIG. 1B is a sectional view along an A-B line thereof.

In FIGS. 1A and 1B, the FPC 100 is formed with an array of a plurality of signal wires 10 sandwiched on either side (in other words, at the two end portions 120 of the FPC 100 in the direction of width) by guiding core wires 20 constituted by a shape memory material. Note that although the signal wires 10 of the FPC 100 in FIG. 1B are arranged in coplanar form, the signal wires 10 may be arranged on a plurality of layers depending on the type of the FPC 100.

The signal wires 10 are conductors for transmitting predetermined electric signals in the direction of length. A connection portion 110 for connecting the signal wire 10 to a predetermined connector within an electronic instrument is formed on the end portion of the signal wire 10 in the direction of length. Depending on the type of the FPC 100, the connection portion 110 may be formed on both ends in the direction of length, or on only one end.

The guiding core wires 20 are formed parallel to each other in the direction of length of the FCP 100. A shape memory alloy or a shape memory resin is used as the shape memory material constituting the guiding core wires 20. The material properties of the shape memory material must be determined in detail according to the wiring operation procedure, the operating environment temperature, the secure temperature of the electronic components, and so on, and hence in the following description, an example will be provided in which a shape memory alloy which is easily deformed by external force at a higher temperature than a boundary temperature for restoring a memorized shape (to be referred to as the "shape restoring temperature") and which returns to the memorized shape at or below the "shape restoring temperature" is used. The guiding core wire 20 has a resistance value for heating itself to a higher temperature than the shape restoring temperature by means of electric conduction. This resistance value differs from the resistance value of the signal wires 10 for transmitting electric signals, and is typically higher than that of the signal wires 10.

Figure 2A:
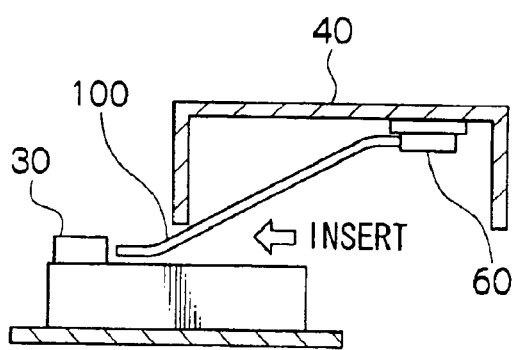
FIGS. 2A and 2B are views showing an example of a wiring operation shape and a wiring completion shape of the flexible print circuit to which the present invention is applied.
Figure 2B:
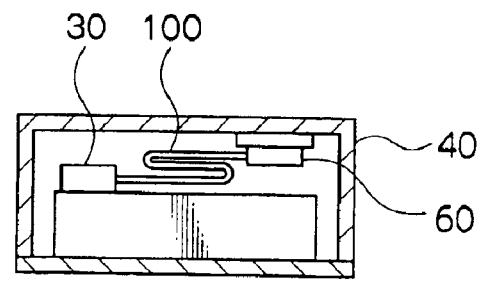

An example of a wiring operation of this type of FPC 100 will be described using FIGS. 2A and 2B. FIG. 2A is a sectional view of an electronic instrument during insertion of the FPC 100 into a connector 30, and FIG. 2B is a sectional view of the electronic instrument when covered by a cover 40. As shown in FIG. 2A, one end of the FPC 100 in the direction of length is inserted into the connector 30, and the other end is connected directly to an electronic component 60 attached to the cover 40. Note that when the FPC 100 is to be inserted into the connector 30, connection with the connector 30 is difficult unless the FPC 100 has a shape which extends in the direction of length. Moreover, as shown in FIG. 2B, when the cover 40 is closed, the FPC 100 must be accommodated in a folded shape. In other words, although it is difficult to connect the FPC 100 to the connector 30 in a folded shape, the FPC 100 must be housed within the electronic instrument in a folded shape.

First, the guiding core wires 20 of the FPC 100 memorize a folded shape such as that shown in FIG. 2B at a predetermined temperature that is lower than the shape restoring temperature. In actuality, causing the guiding core wires 20 to memorize the folded shape causes the entire FPC 100 to memorize the folded shape.

Prior to the wiring operation, first the guiding core wires 20 are heated to a predetermined temperature that is higher than the shape restoring temperature. More specifically, the guiding core wires 20 are heated by passing electricity through the guiding core wires 20 alone. Next, an external force is applied to the FCP 100 to deform the FPC 100 into a shape which extends in the direction of length to facilitate insertion into the connector 30. Here, the guiding core wires 20 deform in accordance with the external force together with the signal wires 10.

During the wiring operation, one end of the FPC 100 is inserted into the connector 30 as shown in FIG. 2A, whereupon the guiding core wires 20 are cooled to or below the shape restoring temperature such that the guiding core wires 20 are restored to the folded shape. More specifically, by cutting the flow of electricity to the guiding core wires 20, the guiding core wires 20 cool naturally and return to the folded shape. In actuality, the entire FPC 100 returns to the folded shape.

According to the wiring structure of this embodiment as described above, when the FPC 100 is to be inserted into the connector 30, the wiring operation is performed after deforming the FPC 100 into a shape which allows easy connection with the connector 30, whereupon the guiding core wires 20 can be restored to the wiring completion shape. Hence, the operating costs during wiring of the FPC 100 can be reduced, and the reliability and stability of the wiring can be ensured easily. The FPC 100 can also be applied to a case in which forming cannot be performed unless the cover 40 is closed as described above. Shape memory material is also provided on the two end portions 120 in the direction of width, and hence the FPC 100 can be formed without increasing the sectional area beyond that of a case in which the guiding shape memory material is wrapped around the outer periphery of the plurality of signal wires 10, thus saving space.

Note that a bidirectional shape memory material which is capable of memorizing shapes at both high and low temperatures may be used as the shape memory material. For example, a bidirectional shape memory alloy which is capable of returning to a first memorized shape at a high temperature of at least 40° C. and returning to a second memorized shape at a low temperature of no more than 20° C. may be used. When this type of bidirectional shape memory alloy is used, a shape which allows easy insertion into the connector 30 (wiring operation shape) may be memorized as the first memorized shape, and the wiring completion shape may be memorized as the second memorized shape. For example, the shape memory alloy is heated to a high temperature (50° C., for example) before the wiring operation to restore the wiring operation shape, and once the FPC 100 has been inserted into the predetermined connector 30, the shape memory alloy is cooled to a low temperature (10° C., for example) to restore the wiring completion shape.

Further, FIGS. 1A and 1B illustrate a case in which the guiding core wires 20 are provided only at the two end portions 120 of the FPC 100, but when there is a large number of signal wires 10 such that the FPC 100 is wide, the guiding core wires 20 may be interposed between the signal wires 10 in addition to the two end portions 120.

When the guiding core wires 20 are cooled, shape restoration can be performed more quickly by directing a flow of air forcibly onto the FPC 100.

[Second Embodiment]

Figure 3A:
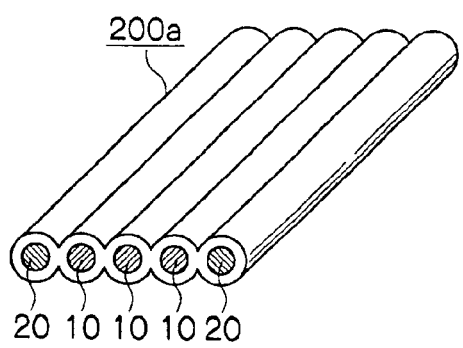
FIGS. 3A and 3B are views showing the main parts of wiring structures of a second and a third embodiment according to the present invention, using the example of a wire harness.
Figure 3B:
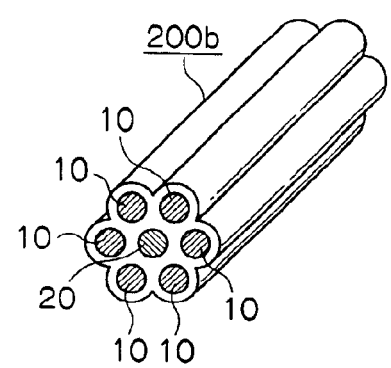

The main parts of a wiring structure of a second embodiment according to the present invention are illustrated in FIGS. 3A and 3B. FIG. 3A illustrates a wire harness 200a (a flat wire harness) in which a plurality of signal wires 10 are arranged in coplanar form and guiding core wires 20 for guiding the signal wires 10 are disposed on the two sides of the array of signal wires 10 in the direction of width (in other words, the two end portions of the wire harness 200a in the direction of width) FIG. 3B illustrates a wire harness 200b (a round wire harness) in which the plurality of signal wires 10 are disposed around the periphery of the guiding core wire 20.

The signal wires 10 are conductors for transmitting predetermined electric signals in the direction of length. An end portion of the signal wire 10 in the direction of length is connected to a predetermined connector within an electronic instrument. Note that in some cases, both ends are connected to connectors, and in others, only one end is connected to a connector.

The guiding core wires 20 are formed parallel to the signal wires 10 in the direction of length of the wire harnesses

200a, 200b. The guiding core wire 20 is formed from a shape memory alloy. The material properties of the shape memory material must be determined in detail according to the wiring operation procedure, the operating environment temperature, the secure temperature of the electronic components, and so on, and hence in the following description, an example will be provided in which a shape memory alloy which is easily deformed by external force at a higher temperature than a boundary temperature for restoring a memorized shape (to be referred to as the "shape restoring temperature") and which returns to the memorized shape at or below the "shape restoring temperature" is used. The guiding core wire 20 has a resistance value for heating itself to a higher temperature than the shape restoring temperature by means of electric conduction. This resistance value differs from the resistance value of the signal wires 10 for transmitting electric signals, and is typically higher than that of the signal wires 10.

Figure 4A:
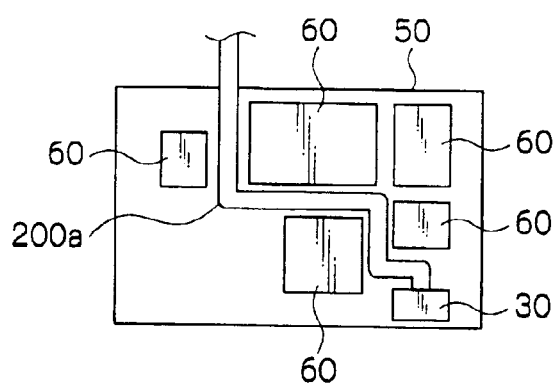
FIGS. 4A and 4B are views showing an example of a wiring completion shape of the wire harness to which the present invention is applied.
Figure 4B:
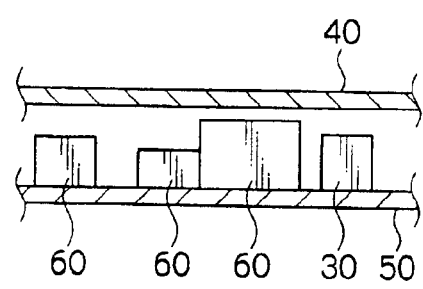

An example of a wiring operation of the flat wire harness 200a shown in FIG. 3A will be described using FIGS. 4A and 4B. FIG. 4A is a view of a substrate 50 on which various electronic components 60 are mounted seen from above, and shows a state following the completion of wiring of the wire harness 200a before a cover 40 is placed on the substrate 50. FIG. 4B is a sectional view of the substrate 50 after the cover 40 has been closed. Note that FIG. 4B is a schematic view omitting the wire harness 200a. As shown in FIG. 4A, one end of the wire harness 200a in the direction of length is inserted into a connector 30. Since the gaps between the electronic components 60 are extremely narrow (only slightly wider than the thickness of the wire harness 200a), the wire harness 200a must be connected following insertion of the wire harness 200a into the connector 30 so as to weave between the electronic components 60 as shown in FIG. 4A. As shown in FIG. 4B, the height of the plurality of electronic components 60 varies, and hence if the wire harness 200a is caught on one of the higher electronic components, the wire harness 200a becomes trapped when the cover 40 is closed. It is therefore necessary to complete wiring ensuring that the wire harness 200a does not become caught on one of the higher electronic components.

First, the guiding core wires 20 of the wire harness 200a are caused to memorize a wiring completion shape such as that shown in FIG. 4A at a predetermined temperature that is lower than the shape restoring temperature. In actuality, causing the guiding core wires 20 to memorize the wiring completion shape causes the entire wire harness 200a to memorize the wiring completion shape.

Prior to the wiring operation, first the guiding core wires 20 are heated to a predetermined temperature that is higher than the shape restoring temperature. For example, warm air is applied to heat the wire harness 200a. Alternatively, a heating method such as that described in the first embodiment, in which electricity is passed through the guiding core wires 20 alone, may be employed. Next, an external force is applied to the wire harness 200a such that the wire harness 200a is deformed into a shape which allows easy insertion into the connector 30. Here, the guiding core wires 20 deform together with the signal wires 10 in accordance with the external force.

During the wiring operation, one end of the deformed wire harness 200a is inserted into the connector 30, whereupon the guiding core wires 20 are cooled to or below the shape restoring temperature such that the guiding core wires 20 are restored to the wiring completion shape shown in FIG. 4A. More specifically, the guiding core wires 20 are cooled naturally to room temperature. When the guiding core wires 20 are heated by electric conduction, cooling may be started by cutting the flow of electricity immediately before insertion into the connector 30. Further, shape restoration may be quickened by directing a flow of air forcibly toward the wire harness 200a.

According to the wiring structure of this embodiment as described above, when the wire harness is to be inserted into the connector 30, the wiring operation is performed after deforming the wire harness into a shape which allows easy connection to the connector 30, whereupon the guiding core wires 20 can be restored to the wiring completion shape. Hence, the operating costs during wiring of the wire harness can be reduced, and the reliability and stability of the wiring can be ensured easily. Furthermore, shape memory material is provided on the two end portions in the direction of width or along the central axis, and hence the wire harness can be formed without increasing the sectional area beyond that of a case in which the guiding shape memory material is wrapped around the outer periphery of the plurality of signal wires 10, thus saving space.

Note that a bidirectional shape memory material which is capable of memorizing shapes at both high temperatures and low temperatures, as described in the first embodiment, may be used as the shape memory material.

Further, in FIG. 3A, a case is illustrated in which the guiding core wires 20 are disposed only at the two end portions of the wire harness 200a, but when there is a large number of signal wires 10 such that the wire harness 200a is wide, the guiding core wires 20 may be disposed between the signal wires 10 in addition to the two end portions.

[Third Embodiment]

In this embodiment, the round wire harness 200b shown in FIG. 3B is used, and a guiding core wire 20 of the wire harness 200b is caused to memorize a coiled shape in advance.

Here, the term "coiled shape" includes a spiral shape which is coiled upward, and a whorl shape which is wound in coplanar form. In the following description, an example in which the guiding core wire 20 memorizes a spiral shape as the wiring completion shape will be provided. Note that in this embodiment, the wire harness 200b shown in FIG. 3B is formed with narrow signal wires such that when the guiding core wire 20 is restored to the spiral shape, the entire wire harness 200b including the signal wires 10 deforms into the spiral shape together with the guiding core wire 20.

An example of a wiring operation of the wire harness 200b of this embodiment will be described using FIGS. 5A and 5B. FIG. 5A is a sectional view of an electronic instrument during insertion of the wire harness 200b into a connector 30, and FIG. 5B is a sectional view of the electronic instrument when covered by a cover 40. As shown in FIG. 5A, one end of the wire harness 200b in the direction of length is inserted into the connector 30, and the other end is connected directly to an electronic component 60 attached to the cover 40. Note that when the wire harness 200b is to be inserted into the connector 30, connection with the connector 30 is difficult unless the wire harness 200b has a shape which extends in the direction of length.

First, the guiding core wire 20 of the wire harness 200b memorizes a spiral shape such as that shown in FIG. 5B at a predetermined temperature that is lower than the shape restoring temperature. In actuality, causing the guiding core wire 20 to memorize the spiral shape causes the entire wire harness 200b to memorize the spiral shape.

Prior to the wiring operation, first the guiding core wire 20 is heated to a predetermined temperature that is higher than the shape restoring temperature. For example, the guiding core wire 20 is heated by directing warm air toward the wire harness 200b. Alternatively, a heating method such as that described in the first embodiment, in which electricity is passed through the guiding core wire 20 alone, may be employed. Next, an external force is applied to the wire harness 200b such that the wire harness 200b is deformed into a shape extending in the direction of length, enabling easy insertion into the connector 30. Here, the guiding core wire 20 deforms together with the signal wires 10 in accordance with the external force.

During the wiring operation, one end of the deformed wire harness 200b is inserted into the connector 30, whereupon the guiding core wire 20 is cooled to or below the shape restoring temperature such that the guiding core wire 20 is restored to the spiral shape. For example, the guiding core wire 20 is cooled naturally to room temperature. When the guiding core wire 20 is heated by electric conduction, cooling may be started by cutting the flow of electricity immediately before insertion into the connector 30. In actuality, the wire harness 200b returns to the spiral shape (wiring completion shape) shown in FIG. 5B.

Note that in this embodiment, the guiding core wire 20 does not have to be provided through the entire direction of length of the wire harness 200b, and the guiding core wire 20 need only be provided in the spiral-shaped part thereof on the substrate side which is inserted into the connector 30. Moreover, even when the guiding core wire 20 is provided through the entire direction of length of the wire harness 200b, only the part on the substrate 50 side which is inserted into the connector 30 need be caused to memorize the spiral shape. By providing a support member 70 for supporting the wire harness 200b about the spiral axis, stability can be improved even further. The support member 70 protrudes in the vicinity of the connector 30 perpendicular to the plane of the substrate 50 on which the connector 30 is mounted such that when the wire harness 200b is cooled into the spiral shape, the support member 70 penetrates the spiral axis of the wire harness 200b. In an operating situation in which the wire harness 200b cannot be wound satisfactorily around the support member 70, the support member 70 may be made shorter or omitted.

In FIG. 3B, a case is illustrated in which a single guiding core wire 20 is provided, but a plurality of guiding core wires 20 may be provided depending on the number of signal wires 10.

[Fourth Embodiment]

In a fourth embodiment, as shown in FIGS. 6A through 6F, a guide frame 400 is provided for guiding a wire harness 210 having a plurality of signal wires, and the guide frame 400 is constituted by a shape memory material such that the wire harness 210 can be removed from the movement range of a movable component within the electronic instrument by the guide frame 400.

Note that in FIGS. 6A through 6F, the electronic instrument is a camera, this camera comprising a lens barrier 450 which is capable of movement between an open condition in which an imaging lens (not shown) is exposed and a closed condition covering the imaging lens. One end of the wire harness 210 in the direction of length is inserted into a connector 30 inside the camera, and the other end is connected directly to an electronic component 60 mounted on a front cover 40a. In this type of camera, during a wiring operation and prior to joining the [front] cover 40a to a [back] cover 40b, a part of the wire harness 210 invariably enters the movement trajectory of the lens barrier 450 (the movement range of the lens barrier 450). Once the front cover 40a and back cover 40b have been joined, the wire harness 210 must be removed from the trajectory of the lens barrier 450 to enable the lens barrier 450 to move over the entire movement range.

Figure 6A:
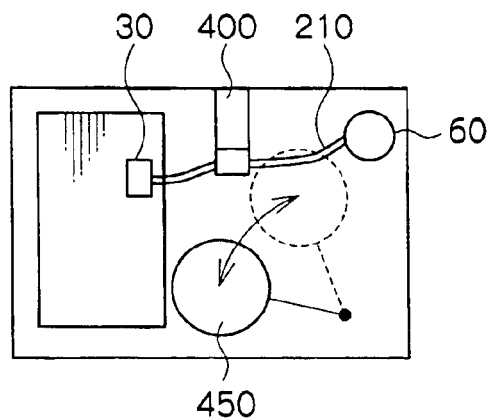
FIGS. 6A through 6F are views illustrating a wiring structure of a fourth embodiment according to the present invention, showing an example of a wiring operation shape and a wiring completion shape in a case where a guide frame is caused to memorize a shape which avoids the movement range of a movable component as the wiring completion shape.
Figure 6D:
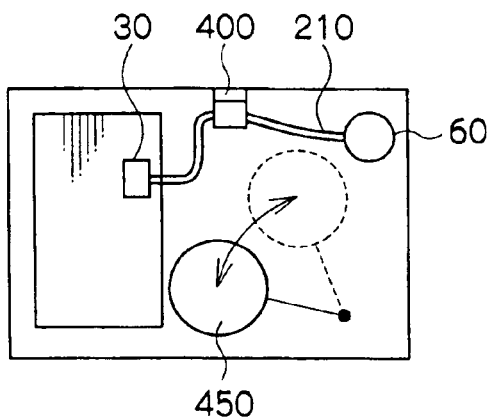
Figure 6B:
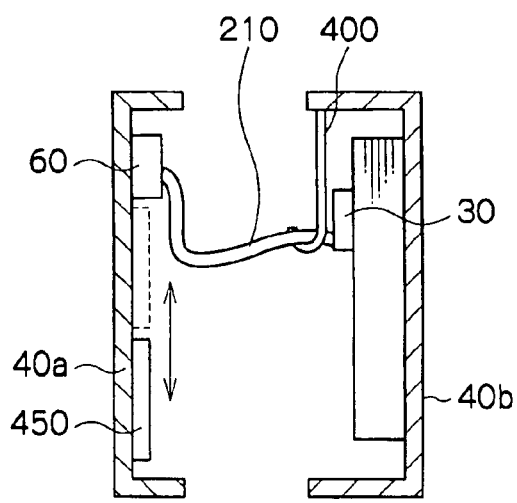
Figure 6E:
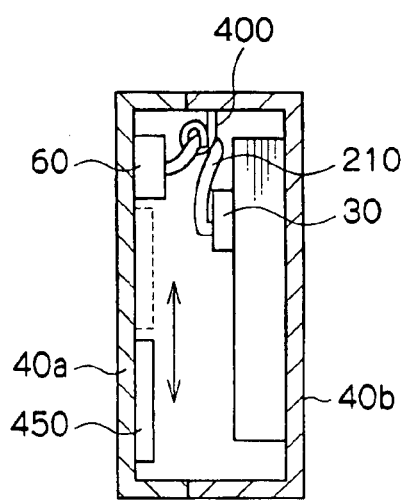
Figure 6C:
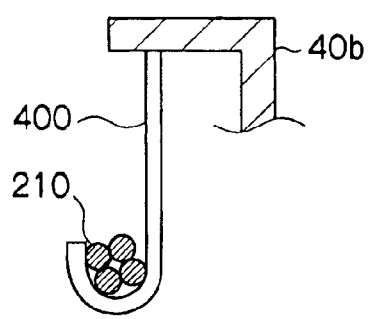
Figure 6F:
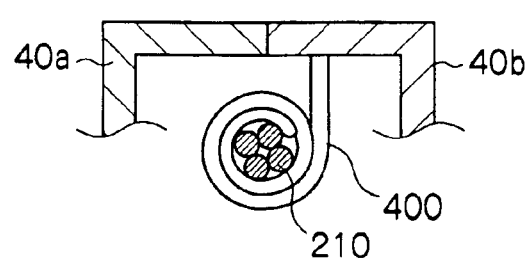

First, the guide frame 400 is caused to memorize a whorl shape such as that shown in FIG. 6F at a predetermined temperature that is lower than the shape restoring temperature.

Prior to the wiring operation, first the guide frame 400 is heated to a predetermined temperature that is higher than the shape restoring temperature. For example, heating is performed by directing warm air to ward the guide frame 400. Next, an external force is applied to the guide frame 400 such that the guide frame 400 extends and deforms into a shape on which the wire harness 210 can be hung, as shown in FIG. 6C.

As shown in FIGS. 6A and 6B, one end of the wire harness 210 is inserted into the connector 30, whereupon the guide frame 400 is cooled and thus restored to the whorl shape shown in FIG. 6F. Here, by directing a flow of air forcibly toward the guide frame, shape restoration may be quickened. The guide frame 400 returns to the whorl shape and is wrapped around the outer periphery of the wire harness 210 such that the wire harness 210 is removed from the trajectory of the lens barrier 450 as shown in FIGS. 6D and 6E.

According to the wiring structure of this embodiment as described above, even when a movable component is present, a wiring operation can be performed with a part of the wire harness 210 disposed within the movement range of the movable component, and once the wiring operation is complete, the guide frame 400 can be shape-restored such that the wire harness 210 is removed from the movement range. Hence, the wire harness 210 can be inserted into the connector 30 easily and securely, complicated forming operations can be eliminated, and the wire harness 210 can be housed inside the electronic instrument with stability. This embodiment is also applicable to a case in which forming must be performed after the cover is closed. Here, a shape memory material does not have to be used for the wire harness 210, and hence the sectional area thereof does not have to be increased.

Note that in the first through fourth embodiments, examples of cases in which the shape memory material is deformed into a shape which allows easy insertion into the connector 30 by being heated, and restored to the wiring completion shape by being cooled, were described. When a heat-sensitive component is included in the electronic components within the electronic instrument such that restoration to the wiring completion shape must be performed immediately before the insertion operation into the connector 30 or following completion of the insertion operation, it is preferable that the shape memory material be restored to the wiring completion shape by cooling as described above. However, in a case where it is possible to provide a cooling period from restoration to the wiring completion shape to implementation of the wiring operation, or a case in which the heating temperature is within the secure temperature range of the electronic component, shape restoration may be performed by heating. More specifically, the shape memory material is heated to at least the shape restoring temperature in order to return to the wiring completion shape, and then cooled.

The wiring structure of the present invention described above may also be applied to a case in which an electronic component is assembled by an automatic assembly machine.

What is claimed is:

1. A flexible print circuit connected to a predetermined location within an electronic instrument, comprising:

a plurality of signal wires for transmitting a predetermined electric signal in the direction of length, and guiding core wires constituted by a shape memory material in which a wiring completion shape within the electronic instrument has been memorized, said guiding core wires being disposed on the two end portions of the flexible print circuit in the direction of width along the signal wires.

2. The flexible print circuit according to claim 1, wherein the wiring completion shape memorized by said guiding core wires is a folded shape within said electronic instrument.

3. The flexible print circuit according to claim 1, wherein said guiding core wire is heated by conducting electricity to said core wire to enable easy deformation, and is cooled by cutting the flow of electricity to enable restoration of said wiring completion shape.

4. A wire harness connected to a predetermined location within an electronic instrument, comprising:

a plurality of signal wires for transmitting a predetermined electric signal in the direction of length, and guiding core wires constituted by a shape memory alloy in which a wiring completion shape within the electronic instrument has been memorized, said wire harness being one of a flat-type wire harness in which said plurality of signal wires are arranged in coplanar form and said guiding core wires are disposed on the two sides of the wire harness in the direction of width, and a round-type wire harness in which said plurality of signal wires are disposed on the outer periphery of said guiding core wire.

5. The wiring harness according to claim 4, wherein the wiring completion shape memorized by said guiding core wires is a coiled shape within said electronic instrument.

6. The wire harness according to claim 4, wherein said guiding core wire is heated by conducting electricity to said core wire to enable easy deformation, and is cooled by cutting the flow of electricity to enable restoration of said wiring completion shape.

7. A wiring structure, comprising:

a wire harness having a plurality of signal wires which are connected to a predetermined location within an electronic instrument, and a guide frame, which is separate and distinct from said wire harness, for guiding said wire harness, wherein said guide frame is constituted by a shape memory material in which a memorized shape that removes said wire harness from the movement range of a predetermined movable component within said electronic instrument has been memorized, said guide frame being restored to said memorized shape after said wire harness is connected to the predetermined location within said electronic instrument.

8. The wiring structure according to claim 7, wherein the memorized shape memorized by said guide frame is so that said guide frame is wrapped around the outer periphery of said wire harness so that said wire harness is removed from the movement range of said movable component.

9. The wiring structure according to claim 8, wherein said guide frame is heated to enable easy deformation, and returns to said memorized shape when cooled.

10. The wiring structure according to claim 7, wherein said guide frame is heated to enable easy deformation, and returns to said memorized shape when cooled.

* * * * *